May 22, 1962 J. L. PHILLIPS, JR 3,036,223

VARIABLE FREQUENCY SYNTHESIZER

Filed Jan. 31, 1958 2 Sheets-Sheet 1

INVENTOR

James L. Phillips, Jr.

BY Stevens, Davis, Miller & Mosher

ATTORNEYS

INVENTOR
James L. Phillips, Jr.

BY Stevens, Davis, Miller & Mosher
ATTORNEYS

United States Patent Office 3,036,223
Patented May 22, 1962

3,036,223
VARIABLE FREQUENCY SYNTHESIZER

James Leo Phillips, Jr., Dallas, Tex., assignor to Texas Instruments Incorporated, Dallas, Tex., a corporation of Delaware Filed Jan. 31, 1958, Ser. No. 712,585
11 Claims. (Cl. 307—88.5)

This invention relates to a transistor circuit for providing a frequency reference signal by a single crystal oscillator adjustable in small discrete steps over a wide frequency range.

Prior to the present invention variable frequency outputs have been obtained by varying the frequency of the oscillator itself. According to the present invention a constant frequency oscillator is used. This feature makes it possible to use a crystal controlled oscillator and hence the frequency of oscillation can be very accurately predetermined. The crystal oscillator feeds into a chain of binary pulse generators, each of which produces a square wave voltage output at a frequency of one-half of its input frequency. The negative going portion of the output wave from each generator is used to trigger the succeeding generator and the generators thus produce square waves at different frequencies. The negative going portion is defined as that part of the square wave which changes in voltage from a high value to a low value. The positive going portion is that part of the square wave which changes in voltage from a low to a high value. With a number of generators connected in series, some of the negative going portions of the square wave outputs will occur at the same time, whereas the positive going portions of the output waves of the various generators are displaced in time from each other. This is true because the negative going portion of the waveform is used to trigger the succeeding binary pulse generator and because each succeeding binary pulse generator has an output frequency equal to one-half of the frequency of the preceding binary pulse generator. A graph of these waveforms would reveal that as the waveform of the triggered binary pulse generator goes positive, each of the waveforms for the preceding binary pulse generator is going negative. Thus, the positive going portions of the square wave can be differentiated and combined to give a wide range in the number of output pulses in a given interval of time. The output pulses will not, in general, be equally spaced but a series of binary count-down stages, which comprise bistable flip-flop frequency dividers, can be used to restore symmetry. The preferred embodiment of the circuit does not make use of the positive going portion of the output waveforms but makes use of the negative going portion of a second waveform produced by each generator. This negative going portion coincides in time with the positive going portion of the output waveform. This mode of operation is used because the negative going portion of the square waveforms have a better rise time characteristic than the positive going portions.

The objects and advantages can be better understood from the detailed description with reference to the figures wherein.

Figure 1:
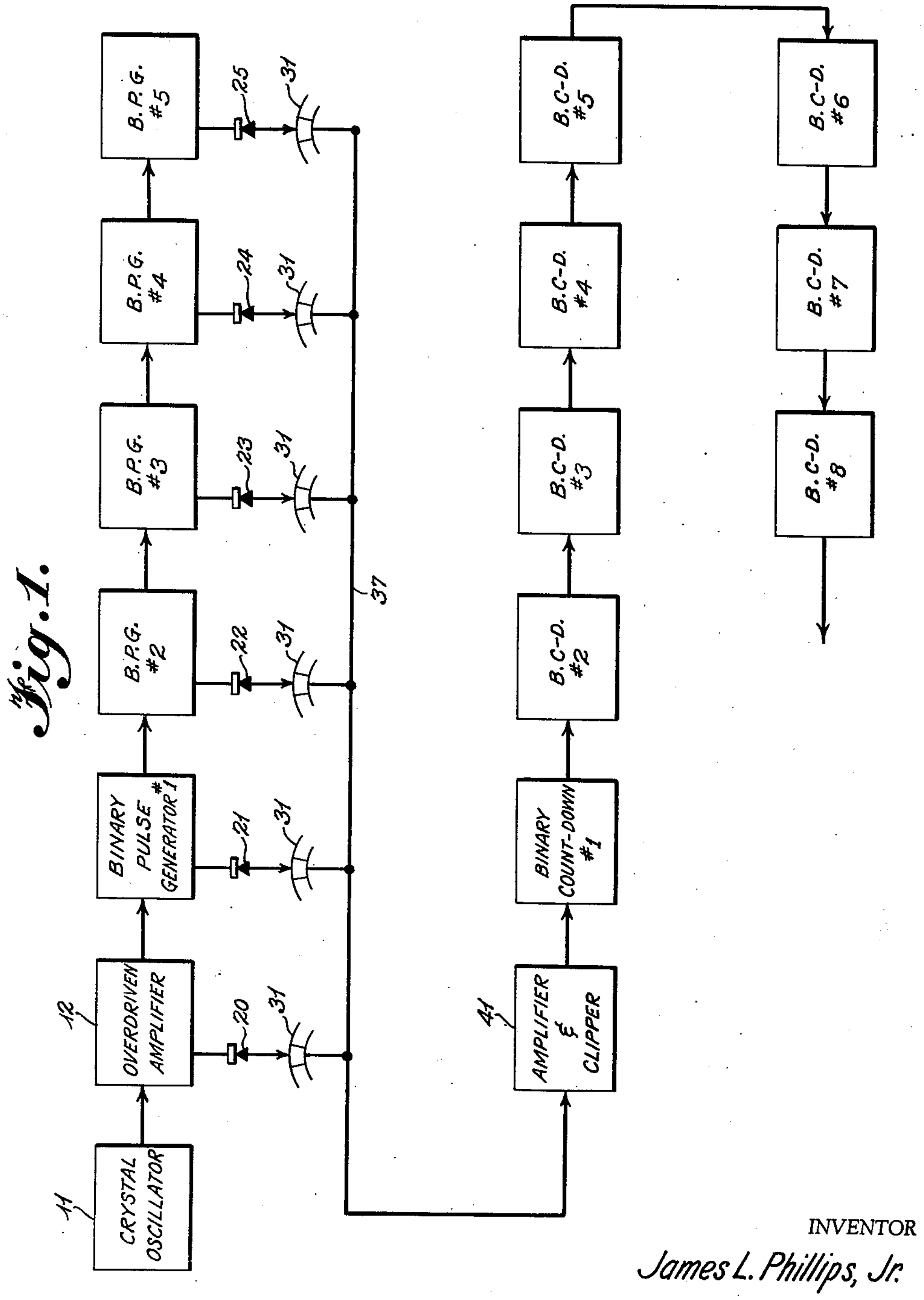
FIGURE 1 shows a block diagram of the circuit of the invention.

Referring to the block diagram illustrated in FIGURE 1, a crystal oscillator 11 generates an output frequency which for convenience we shall designate as 8,192$f$ cycles per second where $f$ can be any positive real number. The output from the oscillator 11 is applied to an amplifier 12. The magnitude of the signal from the oscillator is such as to overdrive the amplifier 12 so that the amplifier produces a square wave output. This square wave output is applied to the first of the series of binary pulse generators Nos. 1 through 5. Nos. 2 through 5 are indicated by the abbreviation "B.P.G." The binary pulse generators each comprise a bistable flip-flop circuit and are designed to flip from one state to the other in response to the negative going portion of an applied input square wave. The binary pulse generators consequently are switched back and forth between their stable states at the rate at which negative going wave portions are applied thereto. There is one such negative going portion for each cycle of a square wave. Since it takes two negative going portions to cause the binary pulse generator to go through a complete cycle of being switched from one state to the other and then back again, the cycling frequency of each generator will be one-half the frequency of the input square wave. Each binary pulse generator produces an output square wave at its cycling frequency. This square wave is applied to the succeeding binary pulse generator. Thus the square wave output from binary pulse generator No. 1 will be one-half of the applied input frequency from the amplifier 12 or 4,096$f$ cycles per second. This 4,096$f$ cycle square wave is applied to the binary pulse generator No. 2 which produces a square wave output at 2,048$f$ cycles per second. The output from binary pulse generator No. 2 is applied to binary pulse generator No. 3 which applies a square wave output of 1,024$f$ cycles per second to the binary pulse generator No. 4. An output square wave of 512$f$ cycles per second is accordingly produced by binary pulse generator No. 4 and is applied to binary pulse generator No. 5 which, as a result produces an output square wave of 256$f$ cycles per second. Because the negative going portions of the output square waves are used to trigger each succeeding stage, some of the negative going portions of the output waveforms of two or more stages will occur simultaneously. However, as described previously, the positive going portions will be displaced in time from each other, that is, none will occur simultaneously. Thus, the output waveforms from each of the binary pulse generators can be differentiated and the resulting positive spikes can be combined to give, within limits, any desired multiple of a predetermined number of output pulses in any given interval of time. By selectively combining the positive pulses obtained from the outputs of the overdriven amplifier 12 and the binary pulse generators Nos. 1 through 5 any multiple of 256$f$ pulses per second can be obtained up to 16,128$f$ pulses per second. It is preferable to use a negative going portion instead of a positive going portion because the square waves produced by the binary pulse generators have a better rise time characteristic when they change from a high value to a low value. Each binary pulse generator and the overdriven amplifier 12 produce a symmetrical oppositely poled waveform which is negative going when the output square wave is positive going. This oppositely poled waveform is differentiated and the negative spikes produced by the differentiation of this waveform are selectively combined to produce the variable output frequencies. The negative and positive spikes produced by the differentiation of the oppositely poled waveform are applied to the rectifiers 20 to 25, and only the negative spikes are passed by these rectifiers to a selective switch 31. The selective switch 31 is only schematically illustrated in the block diagram and serves the function of connecting any combination of the outputs from the rectifiers 20 to 25 to the line 37. This switch 31 with its plurality of contacts is fully described in Patent No. 2,886,661, dated May 12, 1959, on an application of Charles W. Skelton, Jack S. Mason and Frank E. Whisenant, Serial No. 584,126, filed on May 10, 1956, which patent is hereby incorporated by reference. Thus, by merely selecting the desired combination with the switch 31 any frequency output which is a multiple of 256f pulses per second up to 16,128f pulses per second can be produced on the output line 37. For example, suppose it is desired to produce pulses on line 37 at a rate of 11,008f pulses per second. The switch 31 would be operated to apply pulses from the overdriven amplifier 12, the binary pulse generator No. 2, the binary pulse generator No. 4, and the binary pulse generator No. 5 to line 37 over the respective rectifiers 20, 22, 24 and 25. An open circuit would be maintained between the line 37 and the rectifiers 21 and 23 so that no pulses from the binary pulse generators Nos. 1 and 3 are applied to line 37. Since each of these pulses produced by these units occur at different intervals of time, the number of pulses produced on line 37 will be the sum of the frequency outputs of each of the selected units, which sum is 11,008f pulses per second.

The output pulses produced on line 37, although they occur at different time instants, will not be equally spaced from one another. The series of binary count-down stages Nos. 1 through 8 both restore the symmetry of the time spacing between the pulses and reduce the frequency of the signal. The countdown stages Nos. 2 through 8 are indicated by the abbreviation "B.C-D." The negative spikes on line 37 are first applied to the amplifier and clipper circuit 41. The circuit 41 amplifies the negative pulses and clips them so that they are slightly flattened and of uniform amplitude. The negative pulses are then applied to the first of the series of binary count-down stages Nos. 1 through 8. Each of the binary count-down stages Nos. 1 through 8 comprises a bistable flip-flop circuit. After the first binary count-down stage is flipped by a flattened negative pulse, each of the binary count-down stages Nos. 2 through 8 is switched from one stable state to the other by the application of a negative going portion of a square wave in the same manner as the binary pulse generators Nos. 1 through 5. Each stage produces a square wave output, which is one-half the frequency of the square wave applied thereto, and applies its square wave output to the succeeding stage. The square wave produced by each stage will be one-half the frequency produced by the preceding stage. The waveform applied to the binary count-down stage No. 1 is not a square wave but is a series of negative spikes or pulses from line 37 which have been amplified and clipped by the amplifier and clipper circuit 41. These pulses each cause the binary count-down stage No. 1 to switch from one state to the other so that stage No. 1 produces an output frequency which is one-half the number of pulses per second applied from the amplifier and clipper. Since there are 8 binary count-down stages, the last stage produces an output frequency which is $\frac{1}{2^8}$ or $\frac{1}{256}$ of the input pulses per second. The frequency of these input pulses constitutes a value which is a multiple of 256f up to a maximum of 16,128f. Therefore, the output from the last binary count-down stage No. 8 will be any multiple of f cycles per second up to 63f cycles per second. As was stated above, the series of count-down stages Nos. 1 to 8 serves not only to reduce the frequency but also to average the time spacing to make the output more symmetrical.

As an example of the manner in which symmetry is obtained in the output of the binary count-down stages, assume that the input to the amplifier and clipper 41 is from binary pulse generators Nos. 4 and 5 only. This input selection results in the maximum difference in time of the spacing of the pulses from the binary pulse generators on the line 37. The selection of binary pulse generators Nos. 4 and 5 produces 768f pulses per second on line 37 and an output of 3f cycles per second is produced from the binary count-down stage No. 8. The pulses produced on line 37 from binary pulse generator No. 5 have a spacing of 1/256f seconds and the pulses produced on line 37 from binary pulse generator No. 4 have a spacing one-half of that or 1/512f seconds. The sequence of occurrence of the spaces are two short spaces and then one long space. The square wave output from binary count-down stage No. 8 changes state to produce either its negative going or positive going portion once every 256f pulses that is applied to the amplifier and clipper circuit 41. Each of these series of 256f pulses will have approximately the same number of long and short spaces and the greatest variation in the total time interval of the 256f pulses will be 1/512f seconds. The total time interval of the 256f pulses is approximately ⅙ of a second. The variation in the time interval of each half cycle accordingly amounts to only little more than 1% and the output square wave is practically symmetrical. In a similar manner any other frequency which is selected by switch 31 is averaged to become symmetrical by the count-down stages.

The degree of symmetry can be increased by merely increasing the number of count-down stages. This will reduce the frequency of the signal but this can be easily compensated, for example, by using a higher frequency oscillator 11.

The circuit diagram of the binary pulse generators Nos. 1 through 5 shown in FIGURE 2 will be described presently. This circuit is the subject of the co-pending application of Charles W. Skelton, entitled Function Generator, Serial No. 664,139, filed June 6, 1957. Each binary pulse generator has two transistors designated in the figure by the reference numbers 51 and 52. These two transistors have their emitters connected together and to ground over a parallel circuit of a .01 microfarad capacitor 53 and a 1.8 kilohm resistor 54. Power is applied to the circuit by a direct current power source, which has its negative side connected to ground and its positive side connected to line 55. The collector of the transistor 51 is connected to the positive voltage on line 55 over a 4.7 kilohm resistor 56 and the collector of the transistor 52 is likewise connected to line 55 over a 4.7 kilohm resistor 57. The collector of the transistor 51 is also connected to the base of the transistor 52 by means of a parallel circuit of a 10 kilohm resistor 58 and a 0.001 microfarad capacitor 59. The base of the transistor 52 is connected to ground by means of a 15 kilohm resistor 60. The collector of the transistor 52 is connected to the base of transistor 51 over a parallel circuit of a 10 kilohm resistor 61 and a .001 microfarad capacitor 62. The base of the transistor 51 is connected to ground over a 15 kilohm resistor 63. The square wave input from the previous stage is applied over line 64 to a pair of 500 micro-microfarad capacitors 65 and 66. The capacitor 65 is connected in series with a rectifying diode 67 and this series circuit connects the line 64 to the base of the transistor 51. The diode 67 is connected in such a direction to pass only negative pulses from the capacitor 65 to the base of the transistor 51. The junction of the capacitor 65 and diode 67 is connected to the collector of the transistor 51 by means of a 10 kilohm resistor 68. The capacitor 66 is connected in series with a rectifying diode 69 and this series circuit connects the line 64 to the base of the transistor 52. The diode 69 is connected in such a direction that only negative pulses can be passed from the capacitor 66 to the base of the transistor 52. The junction of the diode 69 and the capacitor 66 is connected to the collector of the transistor 52 by means of a 10 kilohm resistor 70.

Figure 2:
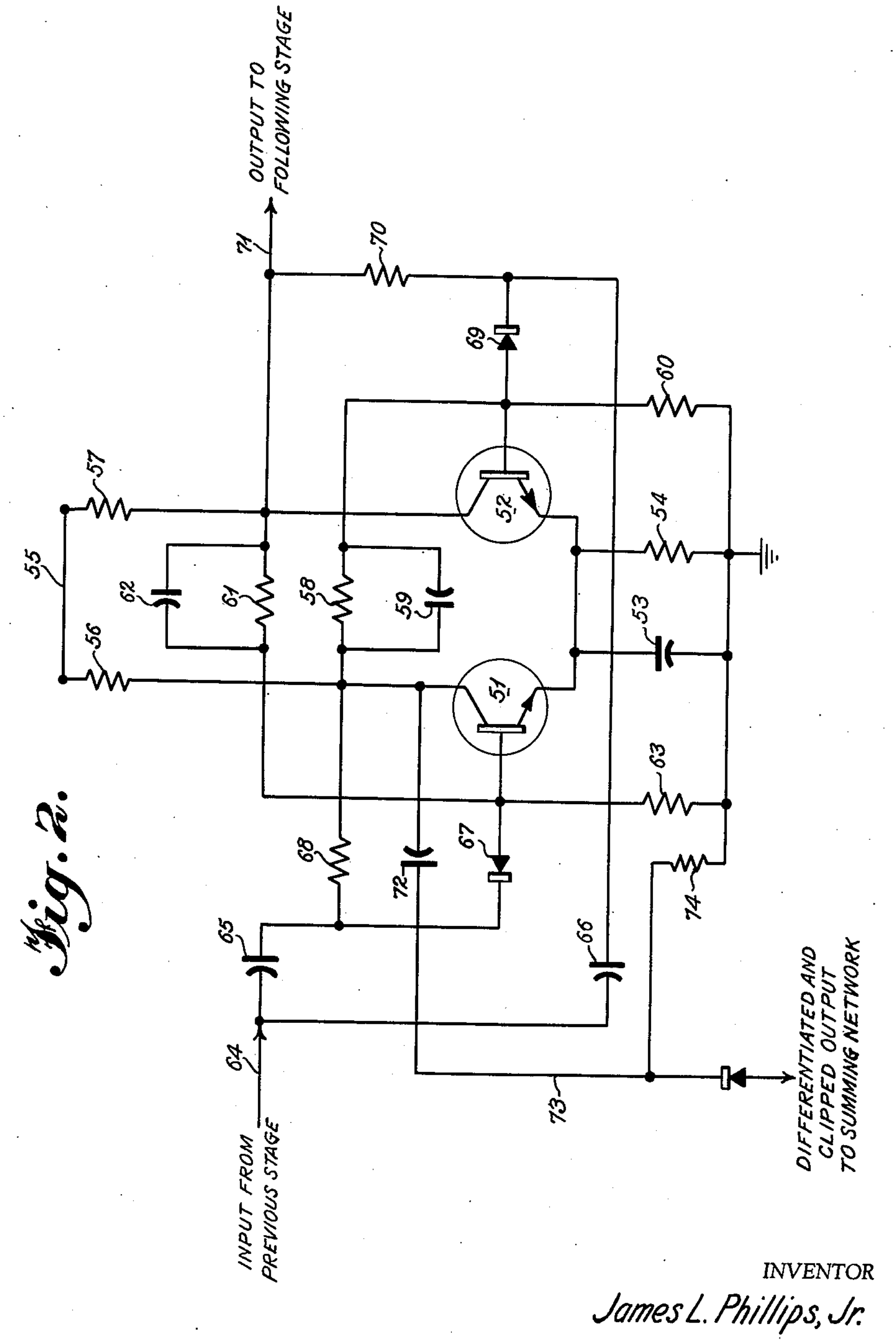
FIGURE 2 shows the detailed circuitry of the binary pulse generators which are indicated in block form in FIGURE 1.

The above described circuit of FIGURE 2 produces an output square wave on line 71 at the collector of the transistor 52. Line 71 applies the square wave to the succeeding binary pulse generator. The collector of the transistor 51 also generates a square wave which is symmetrical with the square wave generated at the collector of the transistor 52 but is of opposite polarity. This waveform will be positive going when the output waveform on line 71 is negative going and vice-versa. A capacitor 72 connects the collector of the transistor 51 to a line 73. The capacitor 72 differentiates the square wave into positive and negative spikes and the line 73 applies these positive and negative pulses through one of the rectifiers 20 through 25, which pass the negative pulses to the selective switch 31. The line 73 is connected to ground through a 10 kilohm resistor 74.

The operation of the circuit of FIGURE 2 will now be described. When the square wave input from the previous stage is applied to the capacitors 65 and 66 from line 64, these capacitors differentiate the waveform into positive and negative spikes, with the positive spikes occurring when the square wave is positive going and the negative spikes occurring when the square wave is negative going. The rectifiers 67 and 69 pass only the negative spikes to the bases of the transistors 51 and 52. Initially, one of the tranistors 51 or 52 will be conducting and the other will be non-conducting. Assuming that the transistor 52 is conducting, current will flow from the line 55 through the resistor 57 to the transistor 52 on down through the resistor 54 to ground. Accordingly, there will be a relatively low voltage at the collector of transistor 52 because of an increased current flow through resistor 57. A voltage divider consisting of resistors 61 and 63 between the collector of transistor 52 and ground applies a low voltage to the base of transistor 51. This low voltage applied to the base of the transistor 51 prevents this transistor from conducting and as a result a high voltage is maintained at the collector of the transistor 51. The resistors 58 and 60 form a voltage divider between the collector of the transistor 51 and ground and therefore the junction between the resistors 58 and 60 apply relatively high voltage to the base of the transistor 52 maintaining this transistor in conduction. Thus, the circuit is in a stable state with the transistor 52 conducting and the transistor 51 non-conducting. When the negative pulses are received by capacitors 65 and 66, they are applied to the base of both transistors 51 and 52. Since the transistor 51 is already non-conducting, the negative pulse will have no effect upon transistor 51. However, the transistor 52 is conducting and the negative pulse applied to the base of this transistor causes a sharp decrease in the conduction through this transistor. This action effects a sharp rise in voltage at the collector of the transistor 52 and this sharp rise in voltage is transmitted to the base of the transistor 51 by means of parallel circuit of the resistor 61 and the capacitor 62. In response to the rise in voltage at the base of the transistor 51, the transistor 51 begins to conduct, thus causing a drop in the voltage at the collector of the transistor 51. This drop in voltage is applied to the base of the transistor 52 by means of a parallel circuit of the resistor 58 and the capacitor 69, causing a further decrease in the conduction of the transistor 52. The action is thus cumulative and as a result the transistor 52 is almost instantaneously switched to a non-conducting state and the transistor 51 is switched to a conducting state. The circuit will remain in this condition in the same manner that it maintains itself in the opposite condition until another negative pulse is differentiated from the square wave applied on line 64. When such a negative pulse is differentiated, the circuit will switch back again to its original state in the same manner with the functions of the transistors reversed so that the transistor 51 becomes conducting again and the transistor 52 becomes non-conducting again. In this manner the circuit will switch back and forth between these two stable states upon the application of each negative pulse differentiated from the square wave on line 64 by the capacitors 65 and 66. This switching action will effect the generation of an output square waveform on line 71 and an oppositely poled symmetrical square waveform at the collector of transistor 51.

Each of the binary count-down stages Nos. 1 through 8 comprise the same circuit as shown in FIGURE 2 except that the output line 73 together with the resistor 74 and the capacitor 72 are eliminated as they are not needed. Such components are employed only at the differentiating network to apply positive and negative pulses by means of rectifiers 20 through 25 to the selective switch 31.

The overdriven amplifier 12 is a two stage device and it functions as a pulse shaper by circuitry similar to the binary pulse generators. An example of a circuit that could be used is disclosed in Patent No. 2,970,226, dated January 21, 1961, on an application of Charles W. Skelton and Jack S. Mason, S.N. 623,385, filed November 20, 1956, which patent is hereby incorporated by reference. The pulse shaper disclosed in this co-pending application is a multivibrator circuit comprising two transistors. In the present application the output to the binary pulse generator No. 1 is taken from the collector of one of the transistors and the output to lead 37 over the rectifiers 20 and the switch 31 is taken from the collector of the other transistor through a differentiating capacitor. The input is applied in the same manner as disclosed in the co-pending application.

The invention, as has been described, provides an apparatus for selectively generating a wide range of accurately predetermined frequencies. By a simple adjustment of the switch 31 any multiple of *f* cycles per second can be obtained up to 63*f* cycles per second. The quantity *f* depends upon the oscillator and may be chosen to suit the needs of the user.

The above invention has been described with transistor components but other non-linear impedances such as vacuum tubes could be used instead. This and many other modifications could be made without departing from the spirit and scope of the invention which is to be limited only as defined in the appended claims.

What is claimed is:

1. An apparatus for generating a variable frequency output comprising a series of bistable means each having a first stable state and a second stable state, means to cause the first one of said series of bistable means to switch back and forth between said first and second stable states at a constant rate, means to cause each succeeding one of said series of bistable means to switch from either state to the other state solely in response to the immediate preceding one of said series of bistable means switching from said first stable state to said second stable state, and output means connectedly responsive to each of said bistable means switching from said second stable state to said first stable state to produce an output pulse having a time duration less than the time interval required for said first one of said series of bistable means to complete one cycle of switching back and forth between said first and said second stable states at said constant rate, and means to combine selectively different combinations of the outputs from said output means.

2. An apparatus for generating a variable frequency output comprising means for generating a predetermined frequency, a series of bistable means each having first and second stable states, means for switching the first bistable means of said series back and forth between said first and second stable states in synchronism with said predetermined frequency, means to cause each succeeding bistable means of said series to switch from either state to the other state solely in response to the immediately preceding bistable means of said series switching from said first stable state to said second stable state, output means connectedly responsive to each of said bistable means switching from said second stable state to first stable state to produce an output pulse having a time duration less than one cycle of said predetermined frequency, and means to combine selectively different combinations of the outputs from said output means.

3. An apparatus as recited in claim 2 wherein said means for generating a predetermined frequency comprises a crystal oscillator.

4. An apparatus for generating a variable frequency output comprising means for generating a predetermined frequency output, means for converting said predetermined frequency output into a voltage square waveform, a series of bistable means each having a first stable state and a second stable state, each of said bistable means producing a direct-current voltage output level changing in one direction when the bistable means switches from said first stable state to said second stable state and changing in the other direction when the bistable means switches from said second stable state to said first stable state, a means connected with each said bistable means for switching such bistable means from either stable state to the other solely in response to an applied voltage changing in one direction, first circuit means for applying the voltage square waveform from said converting means to the first of said series of bistable means, a second circuit means for applying the direct-current voltage output level from each preceding one of said series of bistable means to the immediately succeeding one of said series of bistable means, output means connectedly responsive to each of said bistable means switching from said second stable state to said first stable state to produce an output pulse having a time duration less than one cycle of said predetermined frequency, and means to combine selectively different combinations of outputs from said output means.

5. An apparatus for generating a variable frequency output comprising a series of bistable means each having a first stable state and a second stable state, each of said bistable means producing a direct-current voltage output level changing in one direction when the bistable means switches from said first stable state to said second stable state and changing in the other direction when the bistable means switches from said second stable state to said first stable state, a means connected with each of said bistable means for switching such bistable means from either stable state to the other solely in response to an applied voltage changing in one direction, means for switching the first bistable means of said series of bistable means back and forth between said first and second stable states at a constant rate, circuit means for applying the direct-current voltage output level from each preceding one of said series of bistable means to the immediately succeeding one of said series of bistable means, output means connectedly responsive to each of said bistable means switching from said second to said first stable state to produce an output pulse having a time duration less than the time interval required for said first one of said series of bistable means to complete one cycle of switching back and forth between said first and said second stable states at said constant rate, and means to combine selectively different combinations of outputs from said output means.

6. An apparatus for generating a variable frequency output comprising a series of bistable means each having a first stable state and a second stable state, each of said bistable means producing a direct-current output voltage level changing in one direction when said bistable means switches from said first stable state to said second stable state and changing in the other direction when said bistable means switches from said second stable state to said first stable state, each of said bistable means producing a second direct-current voltage level changing in said one direction when said bistable means switches from said second stable state to said first stable state and changing in said other direction when said bistable means switches from said first stable state to said second stable state, means connected with each said bistable means for switching such bistable means from either stable state to the other solely in response to an applied voltage changing in one direction, means to cause the first one of said series of bistable means to switch back and forth between said first and said second stable states at a constant rate, circuit means to apply said direct-current output voltage level of each of said bistable means to the immediately succeeding one of said series of bistable means, output means connectedly responsive to each of said bistable means producing said second direct-current voltage level, said output means producing an output pulse having a time duration less than the time interval required for said first one of said series of bistable means to complete one cycle of switching back and forth between said first and said second stable states at said constant rate, and means to combine selectively different combinations of outputs from said output means.

7. An apparatus for producing a symmetrical output waveform comprising means for generating a series of aperiodic pulses, a series of bistable means each having a first stable state and a second stable state, means for applying selected combinations of said series of pulses to the first of said series of bistable means, means responsive to each pulse in said selected combinations of said series of pulses for switching the first of said bistable means back and forth between said first and second stable states in synchronism with the selected combination of said series of pulses generated by said generating means, and means to cause each succeeding one of said series of bistable means to switch from either state to the other solely in response to the immediately preceding one of said series of bistable means switching from said first stable state to said second stable state.

8. An apparatus for generating a variable frequency output comprising a first series of bistable means each having a first stable state and a second stable state, means to cause the first one of said first series of bistable means to switch back and forth between said first and second stable states at a constant rate, means to cause each succeeding one of said first series of bistable means to switch from one either state to the other solely in response to the immediately preceding one of said first series of bistable means switching from said first stable state to said second stable state, an output means connected with each one of said first series of bistable means for producing an output pulse each time the said connected bistable means switches from said second stable state to said first stable state, a second series of bistable means each having a first stable state and a second stable state, means to cause the first of said second series of bistable means to switch from one state to the other each time a pulse is produced by one of said output means, and means to cause each succeeding one of said second series of bistable means to switch from one state to the other in response to the immediately preceding one of said second series of bistable means switching from said first stable state to said second stable state.

9. An apparatus for generating a variable frequency output comprising a first series of bistable means each having a first stable state and a second stable state, means to cause the first bistable means of said first series to switch back and forth between said first and second stable states at a constant rate, means to cause each succeeding bistable means of said first series to switch from either state to the other solely in response to the immediately preceding one of said first series of bistable means switching from said first stable state to said second stable state, and output means connectedly responsive to each of said bistable means switching from said second stable state to said first stable state to produce an output pulse having a time duration less than the time interval required for said first one of said first series of bistable means to complete one cycle of switching back and forth between said first and said second stable state at said constant rate, means to selectively combine different combinations of the outputs from said output means on a single channel, a second series of bistable means each having a first stable state and a second stable state, means to cause the first bistable means of said second series to switch from one state to the other each time a pulse is produced on said single channel, and means to cause each succeeding one of said series of bistable means to switch from one state to another in response to the immediately preceding one of said second series of bistable means switching from said first stable state to said second stable state.

10. An apparatus for generating a variable frequency output comprising a series of bistable means each having a first stable state and a second stable state, means to cause the first bistable means of said series to switch back and forth between said first and second stable states at a constant rate, means to cause each succeeding one of said series of bistable means to switch from either state to the other solely in response to the immediately preceding bistable means of said series switching from said first stable state to said second stable state, an output means connectedly responsive to each of said bistable means switching from said second stable state to said first stable state to produce an output pulse having a time duration less than the time interval required for said first bistable means of said series to complete one cycle of switching back and forth between said first and said second stable states at said constant rate, means to selectively combine different combinations of the outputs from said output means on a single channel, and means to generate a symmetrical periodic waveform in synchronism with the pulses on said single channel.

11. The apparatus as claimed in claim 10 wherein said means to generate a symmetrical periodic waveform is a second series of bistable means.

References Cited in the file of this patent

UNITED STATES PATENTS

| | | |
|---|---|---|
| 2,304,813 | Gibbs et al. | Dec. 15, 1942 |
| 2,398,771 | Compton | Apr. 23, 1946 |
| 2,410,156 | Flory | Oct. 29, 1946 |
| 2,424,481 | McCoy | July 22, 1947 |
| 2,486,039 | Langer | Oct. 25, 1949 |
| 2,609,144 | Hamacher | Sept. 2, 1952 |
| 2,766,377 | Frizzell | Oct. 6, 1956 |
| 2,835,812 | Kieffert | May 20, 1958 |
| 2,892,188 | Durbin | June 23, 1959 |